United States Patent
Tateyama

(10) Patent No.: US 7,286,023 B2
(45) Date of Patent: Oct. 23, 2007

(54) CRYSTAL OSCILLATION CIRCUIT WITH FREQUENCY REGULATION

(75) Inventor: Yuichi Tateyama, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/506,076

(22) PCT Filed: Mar. 3, 2004

(86) PCT No.: PCT/JP2004/002635

§ 371 (c)(1),
(2), (4) Date: Aug. 31, 2004

(87) PCT Pub. No.: WO2004/079895

PCT Pub. Date: Sep. 16, 2004

(65) Prior Publication Data

US 2005/0225405 A1    Oct. 13, 2005

(30) Foreign Application Priority Data

Mar. 6, 2003   (JP) .............................. 2003-059546

(51) Int. Cl.
H03B 5/36    (2006.01)
H03B 5/12    (2006.01)

(52) U.S. Cl. .................... 331/158; 331/36 C; 331/160; 331/183

(58) Field of Classification Search ............... 331/158, 331/36 C, 160, 183
See application file for complete search history.

(56) References Cited

U.S. PATENT DOCUMENTS 5,557,243 A * 9/1996 Ho ............................ 331/158
6,018,219 A * 1/2000 Komarek et al. ............ 315/194
6,172,576 B1 * 1/2001 Endo et al. ............. 331/116 R
6,717,482 B2 * 4/2004 Sato et al. ................... 331/154
6,788,159 B2 * 9/2004 Takahashi et al. .......... 331/176
6,861,917 B2 * 3/2005 Stevenson et al. .......... 331/183
2002/0135433 A1   9/2002 Uchiyama et al.
2002/0171500 A1 * 11/2002 Hasegawa et al. .......... 331/179

FOREIGN PATENT DOCUMENTS

| JP | 4-320102 | 11/1992 |
| JP | 5-2435 | 1/1993 |
| JP | 9-102714 | 4/1997 |
| JP | 2000-31741 | 1/2000 |

* cited by examiner

Primary Examiner—Robert Pascal
Assistant Examiner—James Goodley
(74) Attorney, Agent, or Firm—McDermott Will & Emery LLP

(57) ABSTRACT

It is an object of the invention to obtain a stable operation with a low phase noise. Moreover, it is another object to obtain an oscillating output which does not cause the delay of a starting time. According to the invention, it is possible to implement a crystal oscillating circuit capable of superposing a signal obtained by feeding back the oscillating output of a crystal oscillating member (10) by a feedback circuit (5) on a control signal for selecting the load capacity of a load capacity selecting portion (3), and influencing an MOS transistor (50) by the voltage noise of the control signal with difficulty, thereby reducing a phase noise, and furthermore, limiting a control signal to be input to the load capacity selecting portion (3) for a certain time in starting and carrying out the starting in a short time.

3 Claims, 8 Drawing Sheets

CRYSTAL OSCILLATION CIRCUIT WITH FREQUENCY REGULATION

TECHNICAL FIELD

The present invention relates to a crystal oscillating circuit which is an oscillator using a crystal capable of obtaining a comparatively great oscillating output, being started in a short time, and implementing a low phase noise.

BACKGROUND ART

In recent years, a crystal oscillating circuit has often been used for generating a reference frequency in an electronic apparatus, and furthermore, a transmitting data rate has also been increased. In such an electron apparatus, an intermittent operation and a low voltage operation are carried out in order to obtain a low power consumption, and a reference frequency has also been required to have a reduction in a phase noise. For this reason, there has been desired a crystal oscillating circuit in which starting can be carried out in a short time for the crystal oscillating circuit to be used for obtaining these frequencies to be references, a low phase noise is made and a constant oscillating output is obtained. Consequently, the oscillating circuit is very useful as a circuit technique.

There has been known a crystal oscillating circuit described in Patent Document 1, for example. A conventional crystal oscillating circuit will be described below. FIG. 9 is a circuit diagram showing an example of the conventional crystal oscillating circuit. In FIG. 9, 2 denotes an oscillating circuit portion, 3 denotes a load capacity selecting portion, and 10 denotes a crystal oscillating member. The conventional crystal oscillating circuit has such a structure as to supply the power of the oscillating circuit portion 2 by a power terminal 11, to form an oscillating loop by the crystal oscillating member 10, the oscillating circuit portion 2 and the load capacity selecting portion 3, and to control the load capacity selecting portion 3 by a frequency regulating circuit 6, a sensitivity regulating circuit 7 and a frequency setting circuit 8, thereby regulating a sensitivity to be the rate of a change in an oscillation frequency (which will be hereinafter referred to as a frequency sensitivity).

Referring to the crystal oscillating circuit having the structure described above, an operation thereof will be described below. When a power voltage is applied from the power terminal 11, it is supplied to the oscillating circuit portion 2, the load capacity selecting portion 3 and the crystal oscillating member 10, and furthermore, an electric potential is applied to the control terminal of the load capacity selecting portion 3 so that a load capacity seen from the crystal oscillating member 10 is determined and a frequency is determined by (Equation 1) and (Equation 2).

$$f=1/(2\times\pi\times(L1\times C1)0.5)\times(1+C1/(C0+CL)) \; 0.5 \quad \text{(Equation 1)}$$

$$CL=C01\times C02/(C1+C2) \quad \text{(Equation 2)}$$

L1, C1 and C0 in the (Equation 1) and (Equation 2) represent an equivalent circuit constant of the crystal oscillating member, CL represents a load capacity seen from the crystal oscillating member, and C01 and C02 represent a capacity value selected by the load capacity selecting portion.

Moreover, the gate voltage of the MOS transistor of the load capacity selecting portion 3 is controlled to cause an oscillation frequency to be variable in response to a voltage signal controlled by the frequency regulating circuit 6, the sensitivity regulating circuit 7 and the frequency setting circuit 8. When MOS transistors 47 to 49 and 47' to 49' of an MOS transistor portion are set in an OFF state, therefore, a load capacity is equivalent to a non-connection state if capacitors 20, 21, 20' and 21' and switches 35, 36, 35' and 36' connected in series in the switch portions of the load capacity selecting portion 3 are set in an OFF state. Alternatively, a whole load capacity is set to be only a capacity connected in series to the switch depending on the states of the switches 35, 36, 35' and 36' of the switch portion.

To the contrary, when the MOS transistor is set in an ON state, there is set a load capacity for only the capacitors 20, 21, 20' and 21' connected in series to the switches 35, 36, 35' and 36' and a capacitor in an ON state of the MOS transistor if an ON-state resistance thereof is sufficiently low. Therefore, there is freely set a frequency sensitivity by a control voltage to be applied to the gates of the MOS transistors 47 to 49 and 47' to 49' connected in series to the capacitor and the control of the switches 35 to 39 and 35' to 39'.

(Patent Document 1) JP-A-9-102714 Publication

In the oscillating circuit shown in FIG. 9, however, the voltage signal controlled by the frequency regulating circuit, the sensitivity regulating circuit and the frequency setting circuit is applied to the gate of each MOS transistor of the load capacity selecting portion. Therefore, the ON-state resistance of the MOS transistor is changed upon receipt of the influence of the voltage noise of the voltage signal which is controlled. Consequently, the capacitance value of the load capacity selecting portion is changed so that the frequency is varied and a jitter is thus increased. As a result, there is a conventional unsolved problem in that a phase noise is increased.

Furthermore, there is also a problem in that a phase in switching is discontinuously changed in order to switch a load capacity having a predetermined capacitance value, resulting in a remarkable deterioration in the phase noise in such a structure that a load capacity is caused to be variable to change an oscillation frequency in order to change over the load capacity depending on a temperature characteristic.

Moreover, a reduction in a starting time depends on the ratio of an amplitude in starting to an amplitude in a normal state, the value of a negative resistance R, a load capacity and an amplification factor. For this reason, in the oscillating circuit shown in FIG. 9 according to a conventional example, a switch for regulating the sensitivity of a frequency is provided so that a load capacity seen from the crystal oscillating member is connected to make a difference between a negative resistance R and an amplitude to be input to the oscillating circuit in the starting as compared with an oscillating circuit in which the switch is not provided. As a result, there is also a problem in that the starting time is delayed.

In order to solve the problems of the conventional art, it is an object of the invention to provide a crystal oscillating circuit capable of obtaining a stable operation having a low phase noise. Moreover, it is an object of the invention to provide a crystal oscillating circuit capable of obtaining an oscillating output which does not delay a starting time.

DISCLOSURE OF THE INVENTION

The invention provides a crystal oscillating circuit comprising an oscillating portion for oscillating a crystal oscillating member, a load capacity selecting portion for varying an oscillation frequency by a selection of a capacitance value, and a first regulating portion for regulating the capacitance value of the load capacity selecting portion in response to a first control signal supplied to the load capacity selecting portion, wherein the load capacity selecting portion is connected to a second regulating portion for outputting a second control signal in which an integral value for a unit cycle is zero. According to the structure, it is possible to regulate the capacitance value in response to the second control signal in which the integral value for the unit cycle is zero in addition to the regulation of the capacitance value of the load capacity selecting portion in response to the first control signal. Consequently, it is possible to reduce a phase noise caused by the voltage noise of the control signal voltage and to slowly change the oscillation frequency with respect to a change in a voltage in the switching of the capacitance value.

In the crystal oscillating circuit according to the invention, moreover, the second regulating portion generates a signal having an equal frequency to the oscillation frequency.

Furthermore, the crystal oscillating circuit according to the invention further comprises a feedback portion for feeding back an output of the oscillating portion as the second control signal to the load capacity selecting portion.

In addition, in the crystal oscillating circuit according to the invention, the load capacity selecting portion includes a plurality of transistors connected to each other in parallel and having different operating voltages from each other and capacities connected in series to the transistors. According to the structure, the operating voltage of each transistor is varied. Therefore, an input voltage variable range can be increased and an oscillation frequency can be changed more slowly.

Moreover, the crystal oscillating circuit according to the invention further comprises a limiting portion for limiting the first and second control signals supplied to the load capacity selecting portion for a constant time after turning ON a power source. According to the structure, the input of the control signal to the load capacity selecting portion is limited for the constant time after the application of the power voltage. Consequently, a voltage is not applied to the load capacity selecting portion immediately after the application of the power voltage but a capacity seen from the crystal oscillating member is reduced. Consequently, the starting can be carried out in a short time.

In the crystal oscillating circuit according to the invention, furthermore, the transistor is an MOS transistor. In addition, in the crystal oscillating circuit according to the invention, the transistor is a bipolar transistor. In the crystal oscillating circuit according to the invention, moreover, the oscillating portion includes a bipolar transistor and a resistor. Furthermore, the crystal oscillating circuit according to the invention further comprises the crystal oscillating member.

Figure 1:
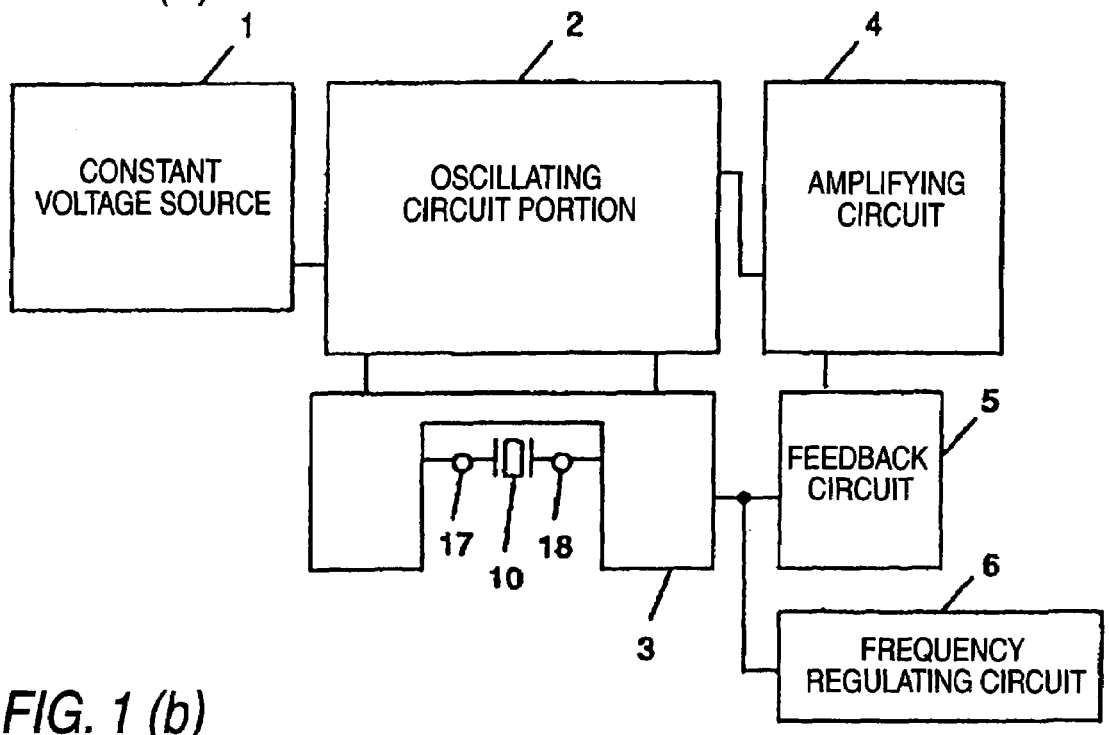
FIG. 1(*a*) is a block diagram showing a crystal oscillating circuit according to an example 1 of an embodiment in accordance with the invention, and FIG. 1(*b*) is a circuit diagram, FIG. 2(*a*) is a block diagram showing a crystal oscillating circuit according to an example 2 of the embodiment in accordance with the invention, and FIG. 2(*b*) is a circuit diagram.
Figure 1:
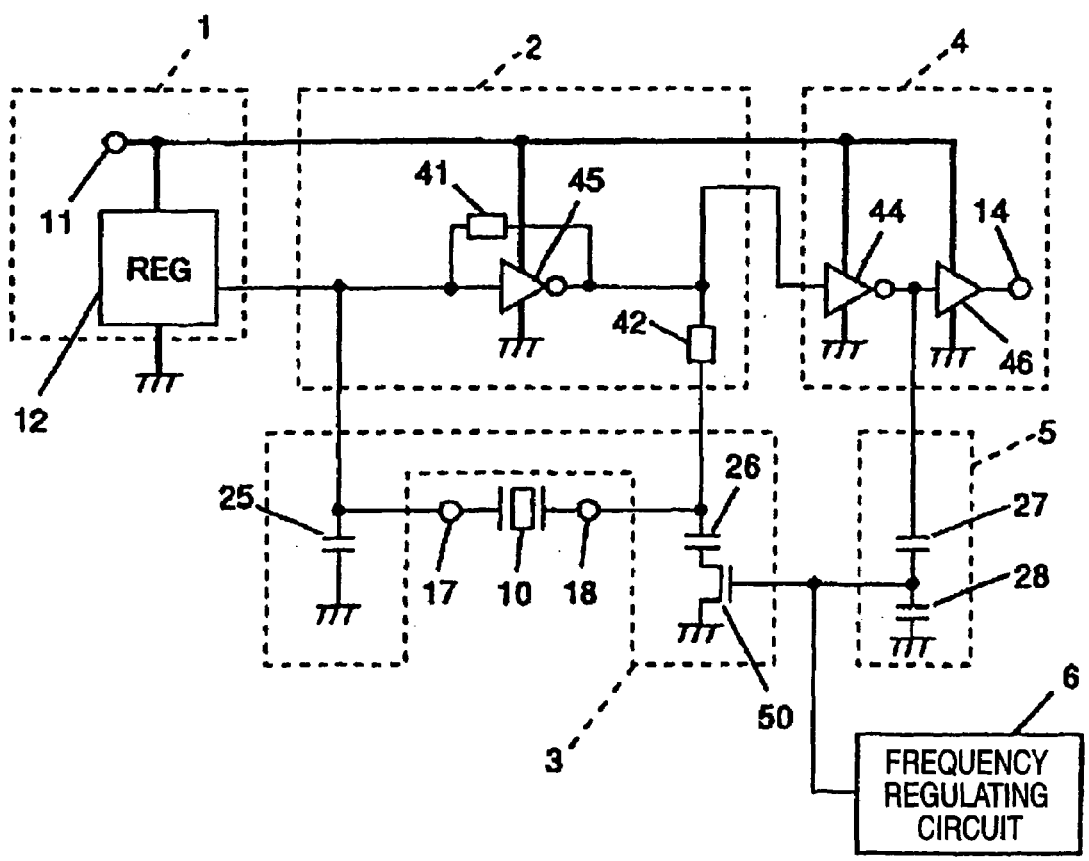

In the drawings, 1 denotes a constant voltage source, 2 denotes an oscillating circuit portion, 3 denotes a load capacity selecting portion, 4 denotes an amplifying circuit, 5 denotes a feedback circuit, 6 denotes a frequency regulating circuit, 7 denotes a sensitivity regulating circuit, 8 denotes a frequency setting circuit, 9 denotes a starting time regulating circuit, 10 denotes a crystal oscillating member, 11 denotes a power terminal, 12 denotes a constant voltage circuit, 14 denotes an output terminal, 15 denotes a terminal for an external application, 17 and 18 denote a crystal connecting terminal, 20 to 28, 30, 31 and 20' to 24' denote a capacitor, 35 to 39 and 35' to 39' denote a switch, 41 to 43 denote a resistor, 44 to 46 denote an inverter, 47 to 52 and 47' to 49' denote an MOS transistor, and 61 denotes a variable voltage source.

BEST MODE FOR CARRYING OUT THE INVENTION

An embodiment of the invention will be described below in detail with reference to the drawings. FIG. 1(*a*) is a block diagram showing a crystal oscillating circuit according to an example 1 of an embodiment in accordance with the invention, and FIG. 1(*b*) is a circuit diagram. As shown in FIG. 1(*b*), a constant voltage is applied from a constant voltage source 1 to an oscillating circuit portion 2 of oscillating means and an amplifying circuit 4 by a voltage applied to a power terminal 11. In the oscillating circuit portion 2, the constant voltage source 1 and an inverter 45 are connected to each other, and furthermore, a resistor 41 is feedback-connected to the input/output terminals of the inverter 45 which are connected to an amplifying circuit 4. Moreover, one of the terminals of a resistor 42 is connected to the output terminal of the inverter 45, and a crystal oscillating member 10 and a capacitor 26 of a load capacity selecting portion 3 to be the load capacity of the crystal oscillating member 10 are connected to the other terminal of the resistor 42.

Furthermore, an MOS transistor 50 is connected in series to the capacitor 26 so as to be a load capacity on one end seen from the crystal oscillating member 10. A capacitor 25 of the load capacity selecting portion 3 to be a load capacity is connected to the other terminal of the crystal oscillating member 10 and is also connected to the input terminal of the inverter 45. Moreover, the output terminal of an inverter 44 in the amplifying circuit 4 is connected to one of the terminals of a capacitor 27 in a feedback circuit 5, and the other terminal of the capacitor 27 is connected to a capacitor 28 and the gate of the MOS transistor 50 of the load capacity selecting portion 3 so that a crystal oscillating circuit is constituted.

Description will be given to the operation of the crystal oscillating circuit according to the example 1 having the structure described above. When a power voltage is applied to the power terminal 11, an REG voltage is output from a constant voltage circuit 12. After the crystal oscillating member starts to be excited, a stable oscillation frequency is supplied by a voltage applied from an outside in order to select a load capacity and a proper capacity selected in the load capacity selecting portion 3 in response to a feedback signal sent from the feedback circuit 5.

At this time, for starting, a time is first determined by a transient voltage applied to the crystal oscillating member 10 immediately after the application of a power and the magnitude of the negative resistance of an oscillating circuit. The transient voltage is determined by an exciting current obtained through the division of the REG voltage by the absolute resistance of the crystal oscillating member 10 and a capacitance value selected in the load capacity selecting portion 3, and a starting time is given as (Equation 3).

$$Tst = 2 \times L1/(R-R1) \times \ln(k) \quad \text{(Equation 3)}$$

L1 and R1 in the (Equation 3) represent an equivalent circuit constant of a crystal oscillating member, k represents a ratio of an amplitude in a steady state to an amplitude in starting, and R represents a negative resistance of the oscillating circuit portion.

It is clear from the (Equation 3) that the starting time depends on the ratio of the amplitude in the starting to the amplitude in the steady state and the negative resistance R. Moreover, the negative resistance R is mainly determined by the operating state of a transistor (a small signal), and the negative resistance R is given as (Equation 4) in the oscillating circuit portion 2 and the load capacity selecting portion 3.

$$R = -gm/(C01 \times C02 \times \omega 2) \quad \text{(Equation 4)}$$

In the (Equation 4), gm represents an amplification rate, C01 and C02 represent a load capacity seen from the crystal oscillating member, and ω represents a frequency angular speed.

It is also clear from the (Equation 4) that the negative resistance R has a dependency of a load capacity and an amplification factor. For a reduction in a starting time in the (Equation 3) and (Equation 4), therefore, the negative resistance R is determined by an amplitude related to the crystal oscillating member 10 in the starting, the ratio of an amplitude in a steady state to an amplitude in starting, the negative resistance R, the load capacity and the amplification factor.

In the crystal oscillating circuit according to the example 1, moreover, an output oscillated by the crystal oscillating member 10 is fed back by the feedback circuit 5 and is applied to the gate of the MOS transistor 50. Consequently, an oscillating output is superposed on a load capacity selecting control signal input from a frequency regulating circuit 6 for controlling the load capacity selecting portion 3 and regulating the frequency sensitivity of an oscillation frequency, and the MOS transistor 50 is influenced by the voltage noise of the load capacity selecting control signal with difficulty. Consequently, a phase noise can be reduced.

Figure 2:
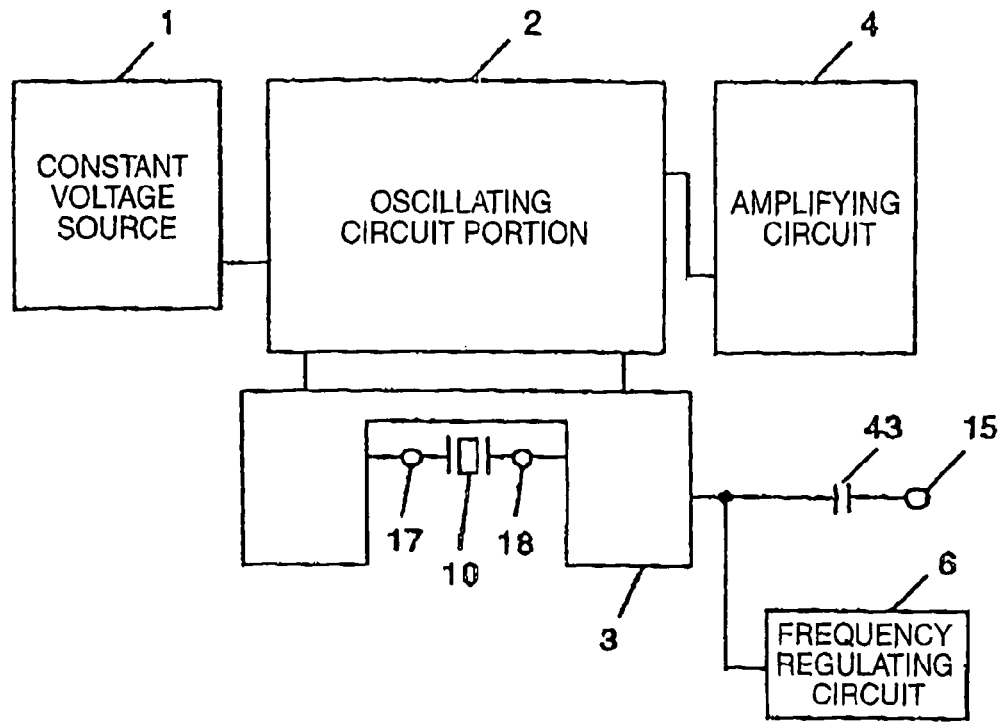
Figure 2:
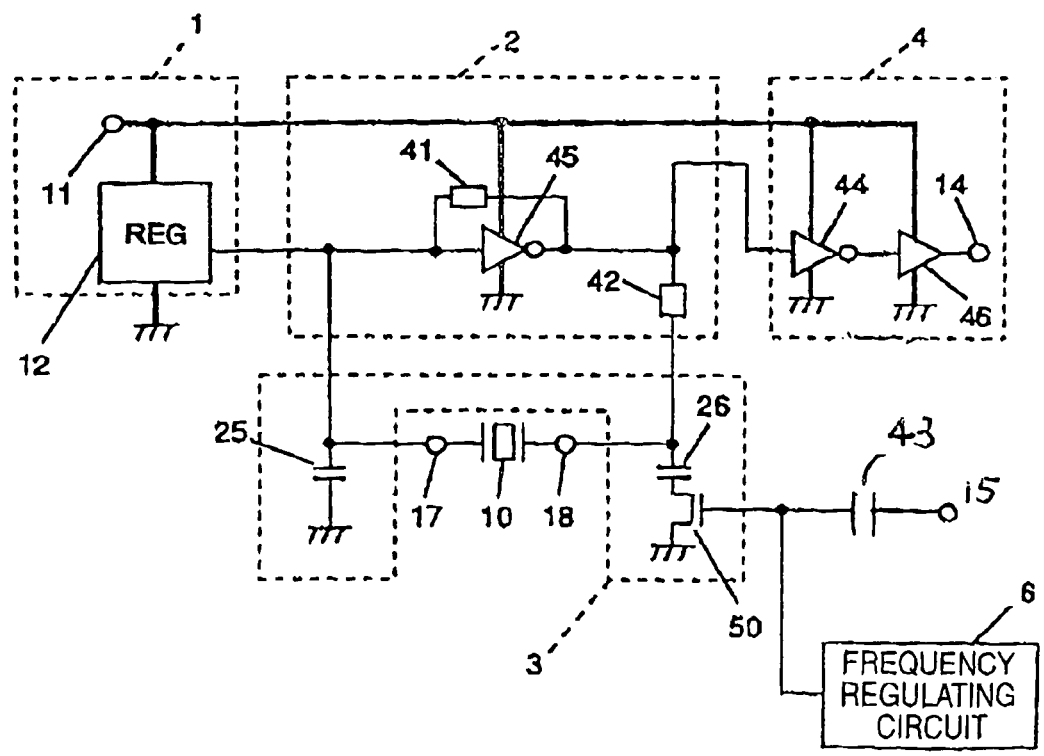

FIG. 2(*a*) is a block diagram showing a crystal oscillating circuit according to an example 2 of the embodiment, and FIG. 2(*b*) is a circuit diagram. As shown in FIG. 2(*b*), the same structure is employed except for such a structure that a terminal 15 for an external application is connected to the gate of the MOS transistor 50 through a capacitor 43 in place of the feedback circuit 5 in the crystal oscillating circuit in FIG. 1(*b*), and components having substantially equivalent functions have the same reference numerals and repetitive description will be omitted.

Also in the example 2, in the same manner as the example 1, a signal having an integral value for a unit cycle to be zero which is input from a terminal for applying an external voltage is superposed synchronously on the load capacity selecting control signal of a load capacity selecting portion 3 which is to be applied to the gate of the MOS transistor 50, and the MOS transistor 50 is influenced by the voltage noise of the control signal with difficulty. Consequently, a phase noise can be reduced.

Figure 3:
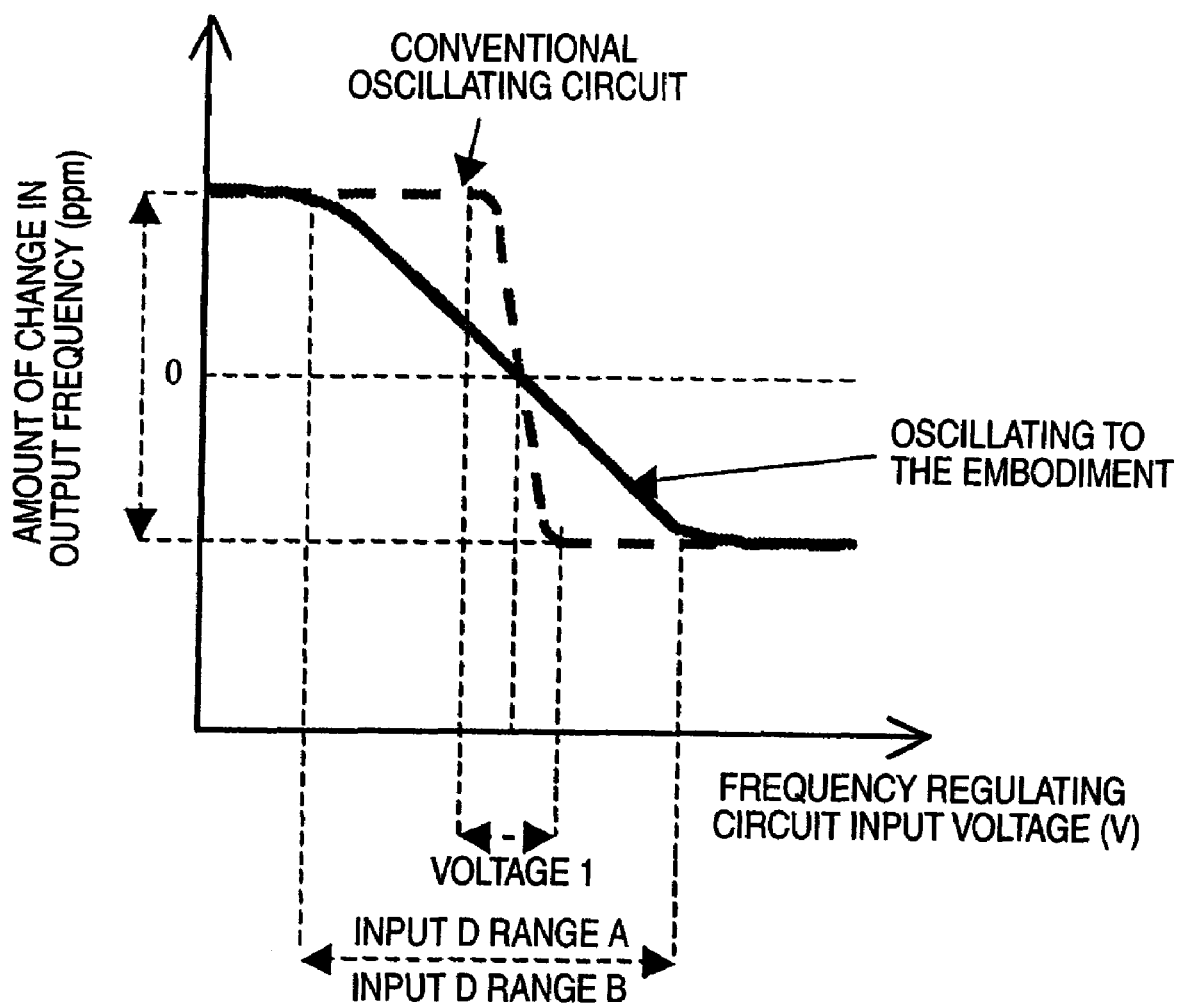
FIG. 3 is a chart showing a change in the output frequency of the crystal oscillating circuits according to the examples 1 and 2, FIG. 4(*a*) is a block diagram showing a crystal oscillating circuit according to an example 3 of the embodiment in accordance with the invention, and FIG. 4(*b*) is a circuit diagram.

FIG. 3 is a chart showing a change in the output frequency of the crystal oscillating circuit according to each of the examples 1 and 2, and an axis of abscissa indicates a voltage input from a frequency regulating circuit 6 and an axis of ordinate indicates the output frequency of the crystal oscillating circuit. As shown in a dotted line, in a conventional oscillating circuit, an output frequency is suddenly changed within a small voltage range (an input D range A) in the vicinity of a voltage 1 to be the operating voltage of the MOS transistor 50. For this reason, in the conventional oscillating circuit, it is necessary to finely set an input voltage or to regulate a voltage by voltage switching in two stages which is equal to or greater than the input D range in order to regulate the output frequency. On the other hand, as shown in a solid line, the output frequency is slowly changed within a wide voltage range (an input D range B) in the vicinity of the voltage 1 in the oscillating circuit according to each of the examples 1 and 2. In the oscillating circuit according to each of the examples 1 and 2, therefore, it is not necessary to finely set the input voltage in order to regulate the output frequency. Thus, the control can easily be carried out.

Figure 4:
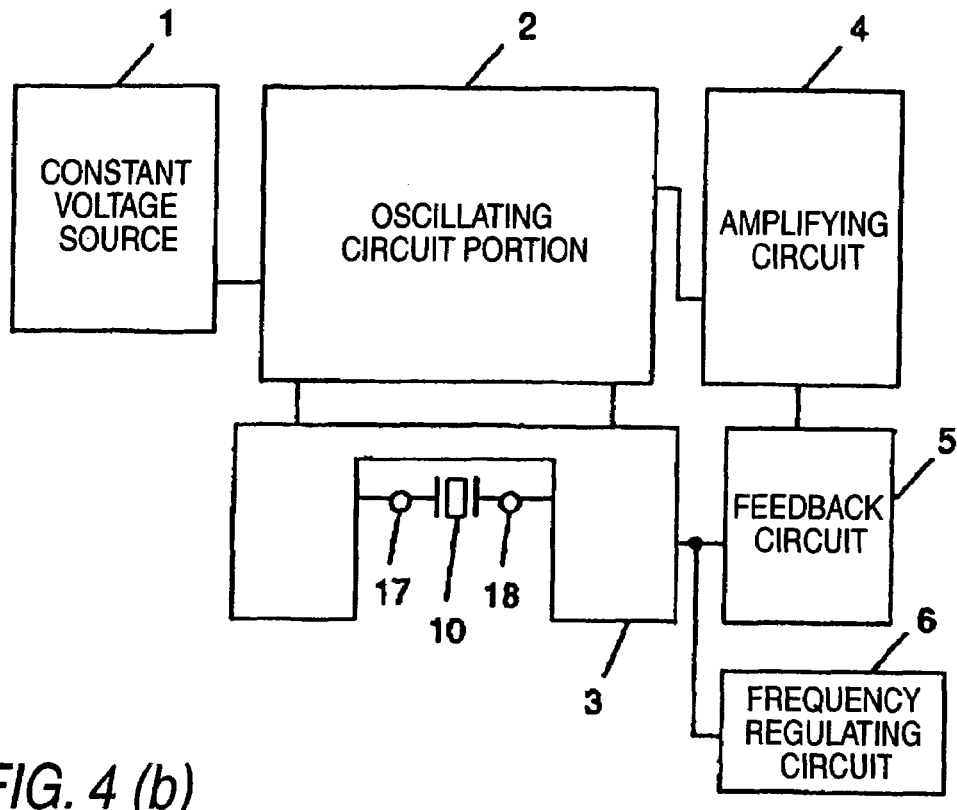
Figure 4:
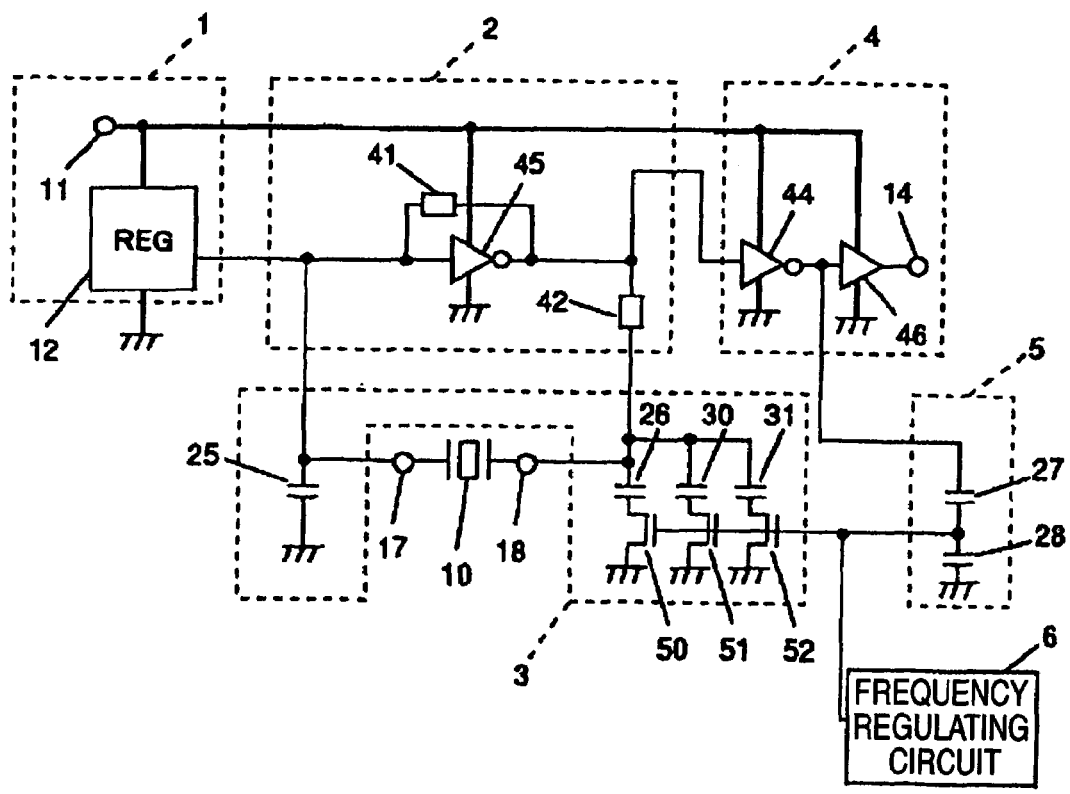

FIG. 4(*a*) is a block diagram showing a crystal oscillating circuit according to an example 3 of the embodiment, and FIG. 4(*b*) is a circuit diagram. As shown in FIG. 4(*b*), the same structure is employed except for such a structure that capacitors 30 and 31 and MOS transistors 51 and 52 are further connected to the load capacity in which the capacitor 26 and the MOS transistor 50 in the load capacity selecting portion 3 in the crystal oscillating circuit shown in FIG. 1(*b*) described above are connected in series. Also in the example 3, components having almost equivalent functions as those in the example 1 have the same reference numerals, and repetitive description will be omitted.

According to the structure shown in FIG. 4(*b*) according to the example 3, the set of the load capacity including the capacitor 26 connected in series to the MOS transistor 50 in the load capacity selecting portion 3 is connected in three stages in parallel. By providing a plurality of load capacities, it is possible to eliminate discontinuous points generated when switching the load capacity through the voltage difference of a control signal.

Figure 5:
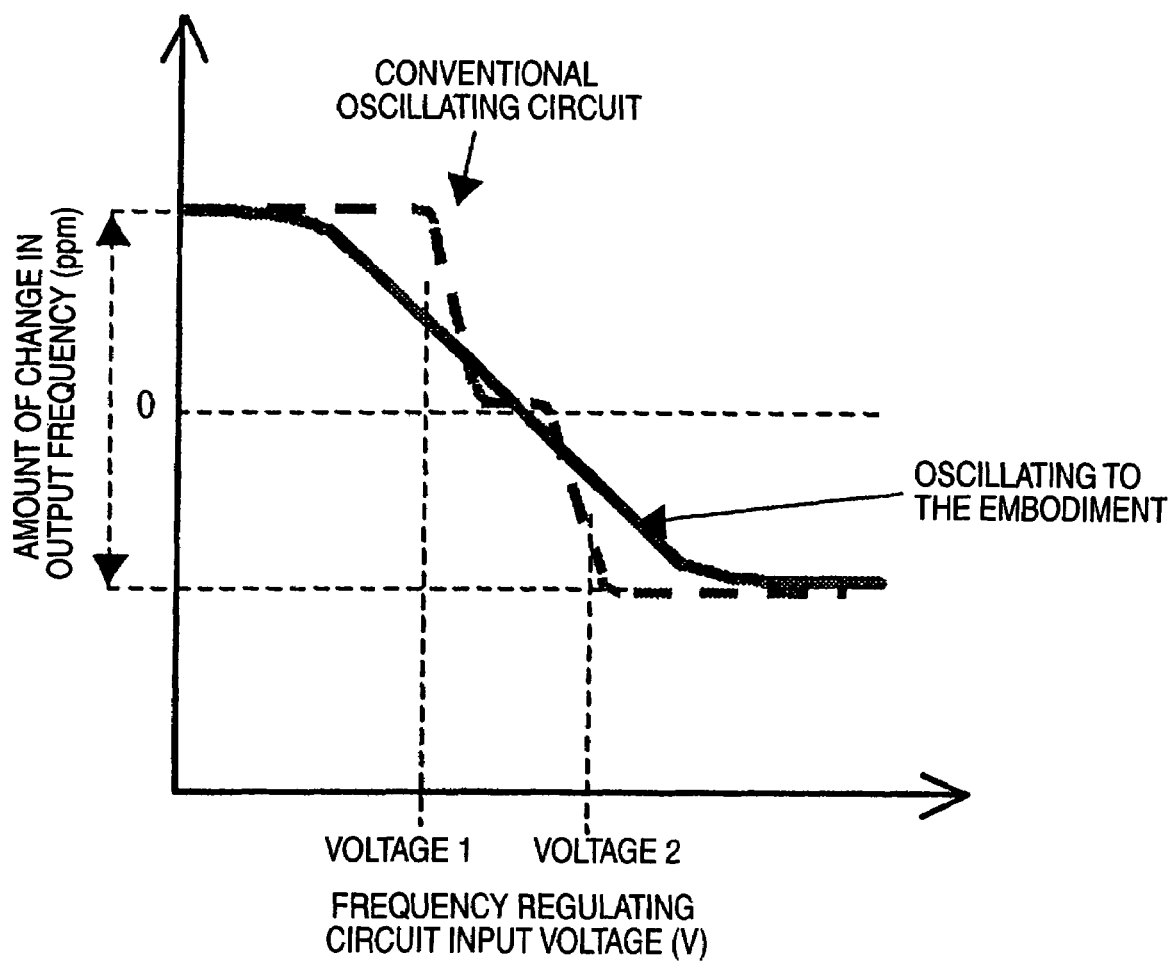
FIG. 5 is a chart showing a change in the output frequency of a crystal oscillating circuit in the case in which a set of a load capacity including an MOS transistor and a capacitor which are connected to each other in series in a load capacity selecting portion is connected in two stages in parallel, FIG. 6(*a*) is a block diagram showing a crystal oscillating circuit according to an example 4 of the embodiment in accordance with the invention, and FIG. 6(*b*) is a circuit diagram.

FIG. 5 is a chart showing a change in the output frequency of the crystal oscillating circuit in the case in which the set of the load capacity including the MOS transistor and the capacitor to be connected to each other in series in the load capacity selecting portion is connected in two stages in parallel, and an axis of abscissa indicates a voltage to be input from the frequency regulating circuit 6 and an axis of ordinate indicates the output frequency of the crystal oscillating circuit. The operating voltages of the MOS transistors are different from each other. As shown in a dotted line, in the conventional oscillating circuit, an output frequency is suddenly changed within a small voltage range in the vicinity of voltages 1 and 2 respectively. For this reason, in the conventional oscillating circuit, it is necessary to change the output frequency as slowly as possible by causing the voltages 1 and 2 to be close to each other and to finely set the input voltage in order to regulate the output frequency. On the other hand, as shown in a solid line, the output frequency is slowly changed within a wide voltage range in the vicinity of the voltages 1 and 2 in the oscillating circuit according to the example. In the oscillating circuit according to the example, therefore, the operating voltages of the transistors are different from each other. Consequently, it is possible to increase an input voltage variable range and to change the oscillation frequency more slowly. According to the oscillating circuit of the example, therefore, it is not necessary to finely set the input voltage in order to regulate the output frequency. Thus, the control can be carried out more easily.

Figure 6:
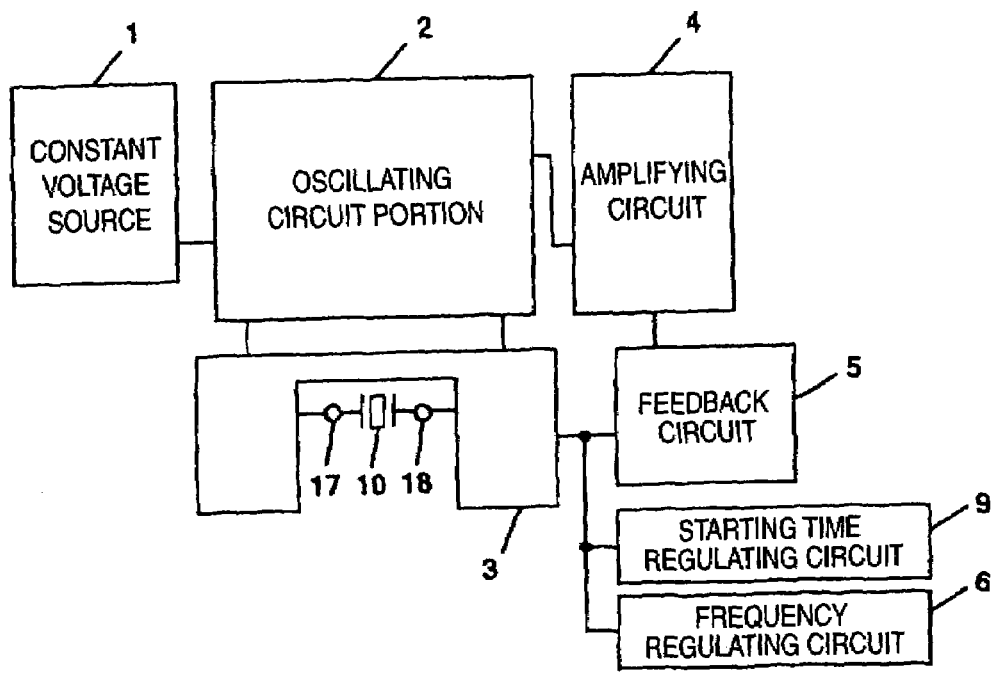
Figure 6:
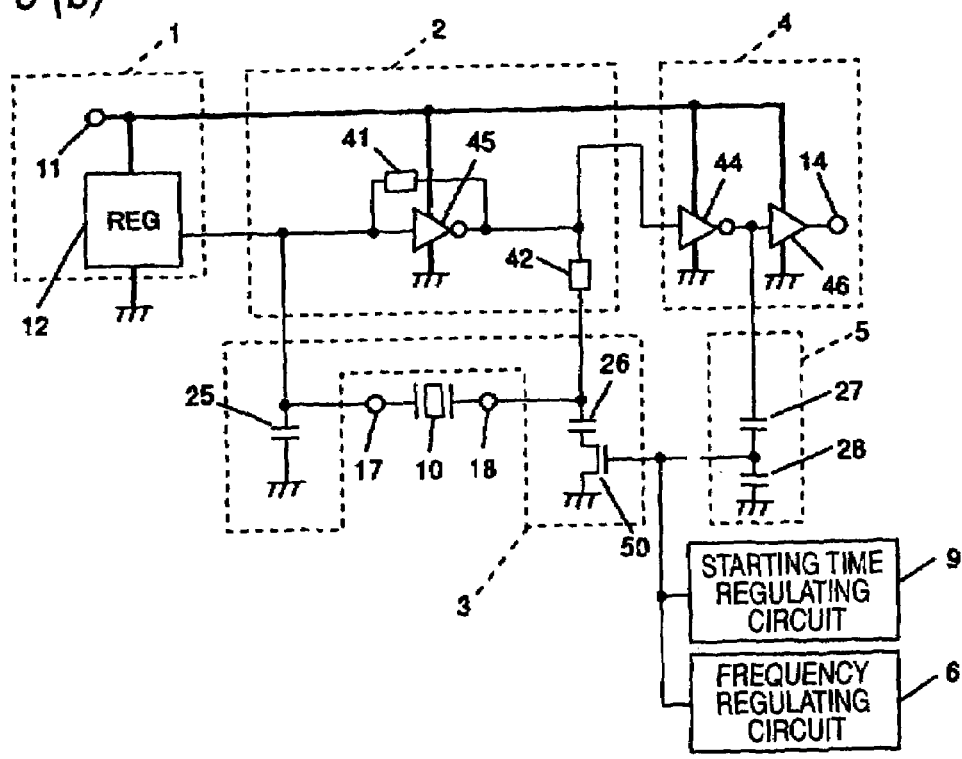

FIG. 6(a) is a block diagram showing a crystal oscillating circuit according to an example 4 of the embodiment, and FIG. 6(b) is a circuit diagram. As shown in FIG. 6(b), the same structure is employed except for such a structure that there is provided a starting time regulating circuit 9 for applying a GND or a pulse for a certain period to the gate of the MOS transistor 50 in the load capacity selecting portion 3 during starting in the crystal oscillating circuit shown in FIG. 1(b) described above, and components having substantially equivalent functions have the same reference numerals and repetitive description will be omitted.

In the example 4, the input of a control signal to the load capacity selecting portion 3 is limited for a certain time after the starting by the starting time regulating circuit 9. Referring to an REG voltage to be the output voltage of a constant voltage source 1, therefore, an REG voltage is applied as a transient voltage to a crystal oscillating member 10. The crystal oscillating member 10 is excited and started to be oscillated by an exciting current obtained through the division of the REG voltage by the absolute resistance of the crystal oscillating member 10. After the crystal oscillating member 10 is excited, the signal of an oscillating output fed back from a feedback circuit 5 is superposed on the control signal of a voltage to be applied from a frequency regulating circuit 6 so that a proper load capacity can be selected by the load capacity selecting portion 3 and a stable transmission frequency can be obtained. According to the example 4, an oscillation can be started in a short time. After the starting, furthermore, a stable oscillation frequency can be supplied.

By the structure of the circuit in which a shock shortage determined by the negative resistance R causing the delay of a starting time in a power voltage operation and a load capacity is improved and the feedback signal of the oscillating output and the load capacity selecting control signal are superposed and input to the load capacity selecting portion 3 as described above, it is possible to obtain a crystal oscillating circuit which is started in a short time to implement a low phase noise.

Figure 7:
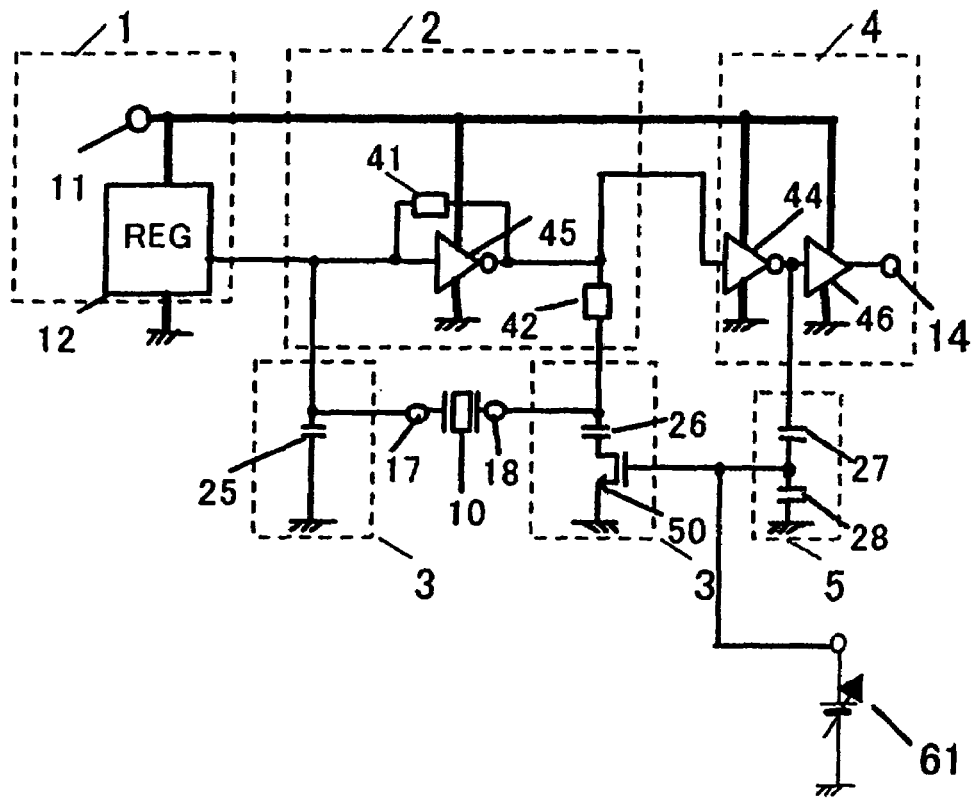
FIG. 7 is a circuit diagram showing a crystal oscillating circuit according to an example of the invention using a variable voltage source (the case in which a load capacity has one stage)
Figure 8:
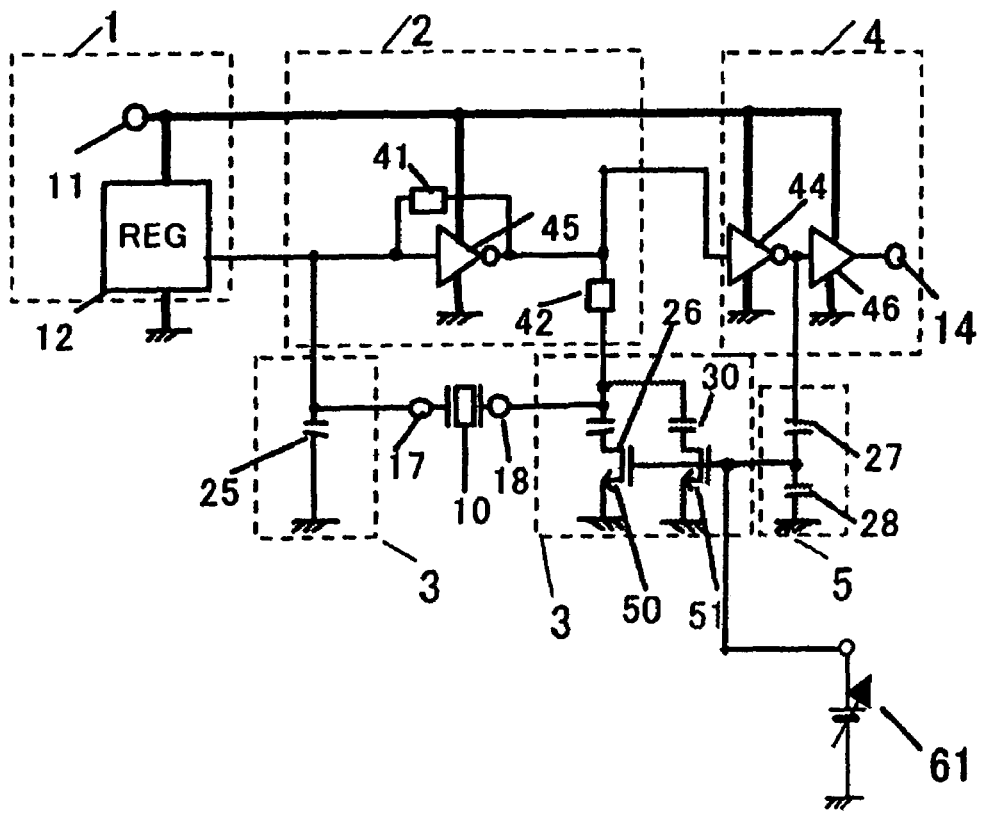
FIG. 8 is a circuit diagram showing the crystal oscillating circuit according to the example of the invention using the variable voltage source (the case in which the load capacity has multiple stages)
Figure 9:
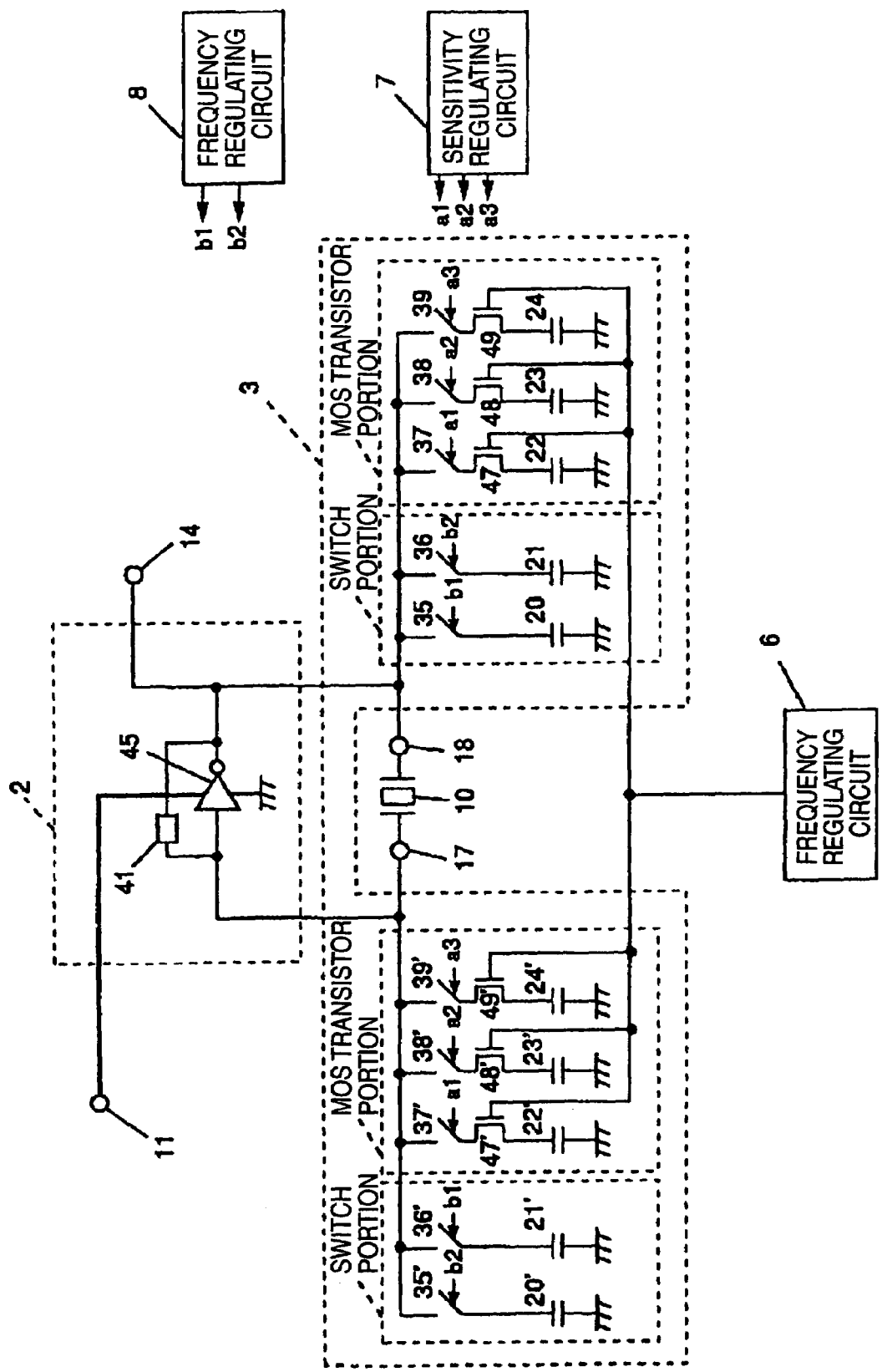
FIG. 9 is a circuit diagram showing a conventional crystal oscillating circuit.

While the description has been given to the case in which the frequency regulating circuit 6 regulates the capacitance value of the load capacity selecting portion in response to the control signal supplied to the load capacity selecting portion, it is also possible to use a variable voltage source in place of the frequency regulating circuit as shown in FIG. 7 (the case in which a load capacity has one stage) and FIG. 8 (the case in which the load capacity has multiple stages).

While the description has been given to the example of the circuit in which the inverter of the oscillating circuit portion 2 and the MOS transistor of the load capacity selecting portion 3 are used in each of the examples, moreover, it is possible to obtain the same advantages even if a bipolar transistor is used in place of the inverter and the MOS transistor.

The application is based on Japanese Patent Application No. 2003-059546 filed on Mar. 6, 2003 and contents thereof are incorporated herein by reference.

INDUSTRIAL APPLICABILITY

As described above, according to the invention, it is possible to obtain an output having a low phase noise by superposing a signal fed back from an oscillating output by a feedback circuit on a load capacity selecting control signal for regulating the frequency sensitivity of an oscillation frequency. According to the invention, moreover, it is possible to produce such an advantage as to implement a crystal oscillating circuit in which the input of a control signal is limited in starting to carry out the starting in a short time, thereby obtaining a stable oscillating output after the starting.

The invention claimed is:

1. A crystal oscillator circuit comprising:
an oscillating portion for oscillating a crystal oscillating member;
a load capacity selecting portion for varying an oscillation frequency by selecting a capacitance value;
a frequency regulating portion for supplying a control signal to the load capacity selecting portion to regulate the capacitance value of the load capacity selecting portion; and
a feed back circuit for synchronously superposing an oscillating output of the crystal oscillating member on the control signal.

2. The crystal oscillating circuit according to claim 1, wherein the load capacity selecting portion includes a plurality of transistors connected to each other in parallel and having different operating voltages from each other and capacities connected in series to the transistors.

3. The crystal oscillating circuit according to claim 1, further comprising a starting time regulating circuit for limiting supplying the control signal for a predetermined period after power is activated.

* * * * *